(12) United States Patent
Ikeda

(10) Patent No.: US 7,190,166 B2
(45) Date of Patent: Mar. 13, 2007

(54) MAGNETIC RESONANCE IMAGING APPARATUS AND MAGNETIC RESONANCE IMAGING METHOD

(75) Inventor: Hitoshi Ikeda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/430,595

(22) Filed: May 9, 2006

(65) Prior Publication Data

US 2006/0255801 A1    Nov. 16, 2006

(30) Foreign Application Priority Data

May 10, 2005   (JP) ............................. 2005-136815

(51) Int. Cl.
*G01V 3/00*   (2006.01)
(52) U.S. Cl. ...................................... 324/318; 324/309
(58) Field of Classification Search ........ 324/300–322; 600/410–424
See application file for complete search history.

(56) References Cited

U.S. PATENT DOCUMENTS

| | | | | |
|---|---|---|---|---|
| 5,184,074 A | * | 2/1993 | Arakawa et al. | 324/309 |
| 5,545,992 A | * | 8/1996 | Foo | 324/309 |
| 5,682,883 A | * | 11/1997 | Fiat | 600/323 |
| 6,225,804 B1 | * | 5/2001 | Lai | 324/309 |
| 6,320,378 B1 | * | 11/2001 | Maier et al. | 324/307 |
| 6,947,787 B2 | * | 9/2005 | Webler | 600/434 |

FOREIGN PATENT DOCUMENTS

JP   2002-165775   6/2002

* cited by examiner

*Primary Examiner*—Brij B. Shrivastav
(74) *Attorney, Agent, or Firm*—Carl B. Horton, Esq.; Armstrong Teasdale LLP

(57) ABSTRACT

The present invention provides a magnetic resonance imaging apparatus and a magnetic resonance imaging method which improve the imaging efficiency. A preview scan initiator unit is provided for initiating a preview scan for scanning the slice position set prior to performing the actual imaging scan. Based on the magnetic resonance signals from the subject obtained by the review scan initiated by the preview scan initiator unit, the preview image for the slice position set by the slice position setting unit is generated to display on the display screen by the display unit.

10 Claims, 5 Drawing Sheets

MAGNETIC RESONANCE IMAGING APPARATUS AND MAGNETIC RESONANCE IMAGING METHOD

CROSS REFERENCE TO RELATED APPLICATIONS

This application claims the benefit of Japan Application No. 2005-136815 filed May 10, 2005.

BACKGROUND OF THE INVENTION

The present invention is related to a magnetic resonance imaging apparatus and magnetic resonance imaging method.

A magnetic resonance imaging (MRI) apparatus is known which uses the nuclear magnetic resonance phenomenon (NMR) to take tomographic images of a subject. The MRI apparatus is widely used in such fields as medical and industrial.

When taking a tomographic image of a subject by using an MRI apparatus, the subject is placed in the imaging field where a static magnetic field is formed, to align the spin direction of protons within the subject in the direction of magnetostatic field to obtain magnetic vector. Then, electromagnetic waves at a resonance frequency are emitted from an RF coil to generate the NMR phenomenon to modify the magnetic vector of the protons. The MRI apparatus then receives the magnetic resonance signals from the protons which fall back to the original magnetic vector by using the RF coil, to generate the tomographic image of the subject based on thus received magnetic resonance signals (as is disclosed in the following patent document 1).

[Patent Document 1] JP-A-2002-165775

When a MRI apparatus is used to perform an actual imaging scan of a subject, the registration scan is needed to be performed in advance to generate and display the registration scan image in order to determine the slice position to perform the imaging scan. For instance, a registration scan image for each of the axial, sagittal, coronal planes of the subject is generated and displayed. Then the operator observes the position registration images to set the slice position to be performed in the actual imaging scan. Then the actual imaging scan at the slice position set on the subject is performed and the actual scanning image is generated based on the MRI signals obtained from the subject during the actual imaging scan.

However, in the actual scanning image thus generated as have been described above there may be cases in which some artifacts happen due to the crosstalk or phase folding, or in which desired section is not captured. There may be cases in which, because of such reasons, the actual imaging scan must be retried to obtain a desirable actual scanning image. In particular such inconvenience becomes evident when the scanning is performed in a multi-slice or multi-angle scheme. This could lead to difficulties of efficiently performing the imaging of a subject.

SUMMARY OF THE INVENTION

Therefore, an object of the present invention is to provide a magnetic resonance imaging apparatus and magnetic resonance imaging method, which may further improve the efficiency of imaging.

The magnetic resonance imaging apparatus in accordance with the present invention, in order to achieve the above cited object, has a slice position setting unit for setting the slice position to perform the actual imaging scan on a subject, and generates the actual scanning image at the slice position of the subject set by the slice position setting unit based on the magnetic resonance signals obtained from the subject by the actual imaging scan, in which the magnetic resonance imaging apparatus incorporates a preview scan initiator unit for initiating a preview scan for scanning the slice position set by the slice position setting unit prior to performing the actual imaging scan, and a preview image generator unit for generating a preview image at the slice position set by the slice position setting unit based on the magnetic resonance signals of the subject obtained by the preview scan initiated by the preview scan initiator unit.

The magnetic resonance imaging method in accordance with the present invention, in order to achieve the above mentioned object, sets a slice position to perform the actual imaging scan on a subject, and generates the actual scanning image at the slice position set on the subject based on the magnetic resonance signals obtained from the subject by the actual imaging scan, the magnetic resonance imaging method includes the first step of initiating a preview scan to scan the slice position set prior to the actual imaging scan, and a second step of generating a preview image at the slice position set based on the magnetic resonance signals from the subject obtained by the preview scan initiated in the first step.

In accordance with the present invention, a magnetic resonance imaging apparatus and a magnetic resonance imaging method are provided which may improve the imaging efficiency.

Further objects and advantages of the present invention will be apparent from the following description of the preferred embodiments of the invention as illustrated in the accompanying drawings.

DETAILED DESCRIPTION OF THE INVENTION

Hereinafter, an exemplary preferred embodiment of the present invention will be described in greater details with reference to accompanying drawings.

Figure 1:
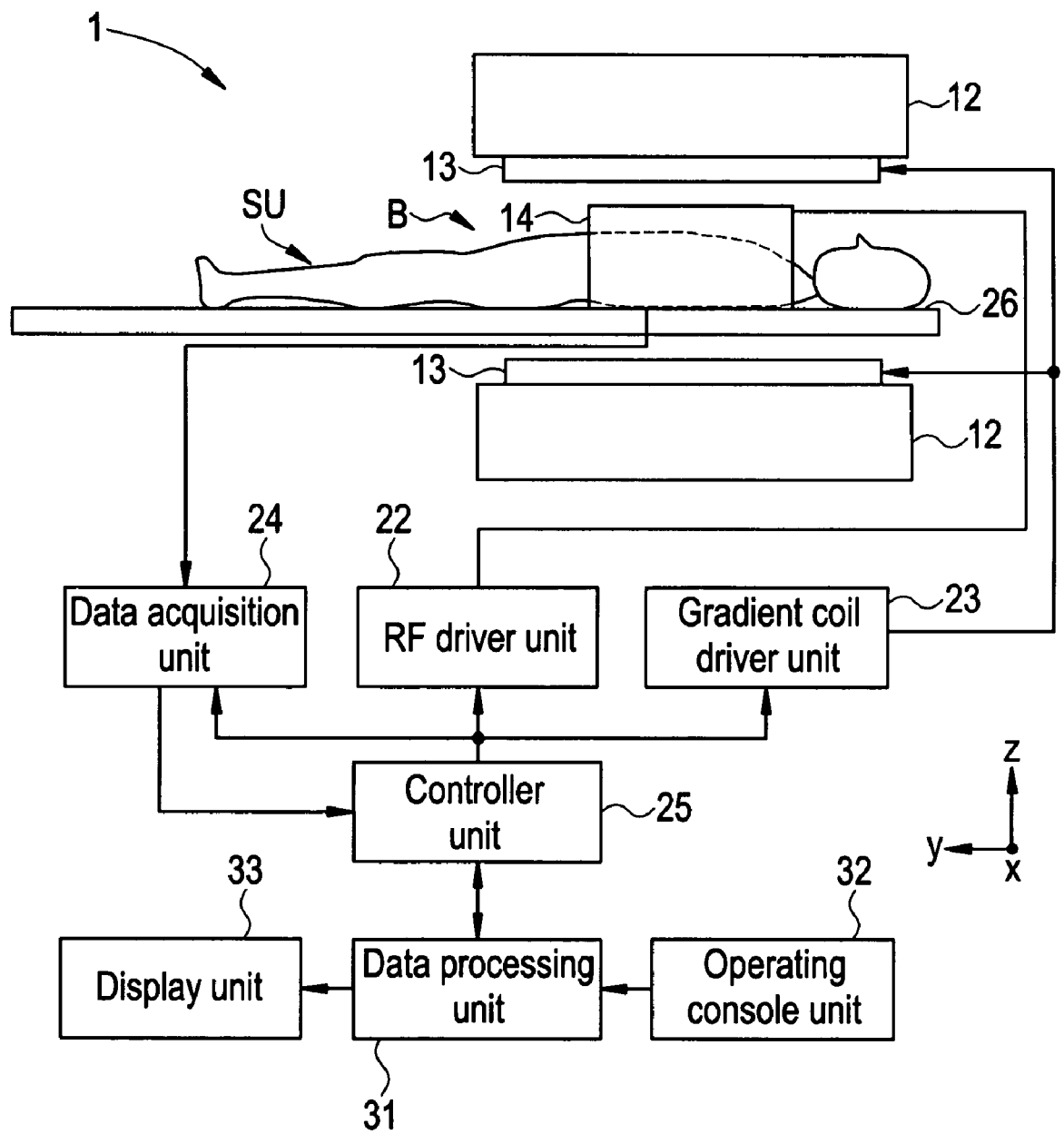
FIG. 1 is a schematic block diagram of a magnetic resonance imaging apparatus 1 in accordance with a first preferred embodiment of the present invention.

Now referring to FIG. 1, there is shown a schematic block diagram of a magnetic resonance imaging apparatus 1 in accordance with a preferred embodiment of the present invention.

As shown in FIG. 1, the magnetic resonance imaging apparatus 1 includes a magnetostatic field magnet unit 12, a gradient coil unit 13, an RF coil unit 14, an RF driver unit 22, a gradient coil driver unit 23, a data acquisition unit 24, a controller unit 25, a cradle 26, a data processing unit 31, an operating console unit 32, and a display unit 33. The magnetic resonance imaging apparatus 1 transmits electromagnetic waves to a subject SU placed in an imaging space B with magnetostatic field formed, to perform a scan for obtaining magnetic resonance signals from the subject SU, to reconstruct an image of the slice of the subject SU based on the magnetic resonance signals thus obtained by the scan.

Now components of the magnetic resonance imaging apparatus 1 in accordance with the preferred embodiment will be described herein below.

The magnetostatic field magnet unit 12 includes for example a pair of permanent magnets placed on opposing sides of the imaging space B, in order to generate a static magnetic field in the imaging space B into which the subject SU is carried in. The magnetostatic field magnet unit 12 generates a magnetostatic field in the vertical direction Z with respect to the opposing pair of permanent magnets. The magnetostatic field magnet unit 12 may be formed of for instance superconductor magnets, instead of permanent magnets.

The gradient coil unit 13 forms a gradient field in the imaging space B with the magnetostatic field formed in order to add the positional information to the magnetic resonance signals to be received by the RF coil unit 14. The gradient coil unit 13 includes three magnet systems, each of which generates a gradient field which inclines into one of three axes perpendicular to each other, and generates a gradient field in each of frequency encoding direction, phase encoding direction, and slice selection direction in accordance with the imaging condition. More specifically, the gradient coil unit 13 applies a gradient field in the slice selection direction of the subject SU, and the RF coil unit 14 transmits an RF pulse in order to select a slice of the subject SU to be excited. The gradient coil unit 13 also applies a gradient field in the phase encoding direction of the subject SU to phase encode the magnetic resonance signals from the slice excited by the RF pulse. The gradient coil unit 13 then applies a gradient field in the frequency encoding direction of the subject SU to frequency encode the magnetic resonance signals from the slice excited by the RF pulse.

The RF coil unit 14 transmits an RF pulse, which is an electromagnetic wave, to the subject SU in the imaging space B in which a magnetostatic field is formed by the magnetostatic field magnet unit 12, to generate a high frequency magnetic field to excite the proton spin in the imaging area of the subject SU. The RF coil unit 14 then receives the electromagnetic waves generated by the protons excited in the subject SU as the magnetic resonance signals.

The RF driver unit 22 drives the RF coil unit 14 to transmit an RF pulse into the imaging space B to generate a high frequency field. The RF driver unit 22, which includes a gate modulator, an RF power amplifier, and an RF oscillator, uses the gate modulator based on the control signals from the controller unit 25 to modulate the signals from the RF oscillator into signals with a predetermined timing and a predetermined envelope, then amplifies with the RF power amplifier the signals modulated by the gate modulator to output to the RF coil unit 14 in order to transmit RF pulses.

The gradient coil driver unit 23 applies a gradient pulse to the gradient coil unit 13 based on the control signals from the controller unit 25 and drives to form a gradient field in the imaging space B in which a magnetostatic field is formed. The gradient coil driver unit 23 comprises three driver circuit systems (not shown in the figure) to accommodate to three systems of gradient coils of the gradient coil unit 13.

The data acquisition unit 24 collects the magnetic resonance signals received by the RF coil unit 14 based on the control signals from the controller unit 25 to output to the data processing unit 31. The data acquisition unit 24 collects magnetic resonance signals phase encoded and frequency encoded so as to comply with k space. The data acquisition unit 24 has a phase detector, which detects phases of the magnetic resonance signals received by the RF coil unit 14 by using the output of the RF oscillator of the RF driver unit 22 as reference signal. Then, The analog magnetic resonance signals are converted into digital signals using an A/D converter. The data acquisition unit 24, having stored the magnetic resonance signals in its memory, outputs to the data processing unit 31.

The controller unit 25 includes a computer, and a program for directing components to perform specific operation in correspondence with a predetermined scan using the computer. The controller unit 25 uses the operation signals input from the operating console unit 32 through the data processing unit 31 to output control signals to each of the RF driver unit 22, the gradient coil driver unit 23, and the data acquisition unit 24 to control, so as to direct to execute a predetermined scan.

Figure 2:
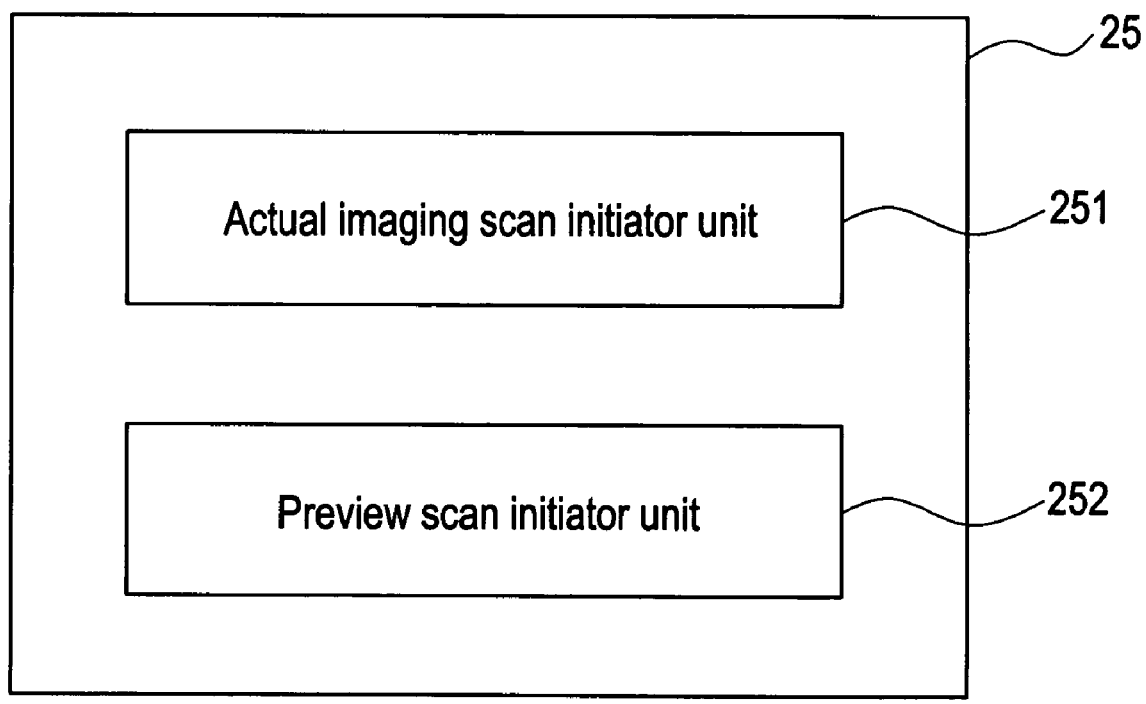
FIG. 2 is a schematic functional block diagram indicating the fundamental arrangement of controller unit 25 in the magnetic resonance imaging apparatus 1 of the first preferred embodiment of the present invention.

Now referring to FIG. 2, there is shown a schematic functional block diagram indicating the fundamental arrangement of controller unit 25 in the magnetic resonance imaging apparatus 1 of the first preferred embodiment of the present invention.

As shown in FIG. 2, the controller unit 25 includes an actual imaging scan initiator unit 251 and a preview scan initiator unit 252.

The actual imaging scan initiator unit 251 of the controller unit 25 initiates the actual imaging scan that scans at the slice position set by a slice position setting unit 311 of the data processing unit 31 as will be described below. The actual imaging scan initiator unit 251 starts the actual imaging scan upon reception of the command from the operator. More specifically, the actual imaging scan initiator unit 251, upon reception of the instruction of starting the actual imaging scan input by the operator through the operating console unit 32, transmits the control signals to each of the RF driver unit 22, the gradient coil driver unit 23 and the data acquisition unit 24 to initiate the execution of actual imaging scan.

The preview scan initiator unit 252 of the controller unit 25 initiates the preview scan that scans at the slice position set by the slice position setting unit 311 of the data processing unit 31 as will be described below, prior to starting the actual imaging scan. The preview scan initiator unit 252, upon reception of instruction of the operator, initiates the preview scan. More specifically, the preview scan initiator unit 252, upon reception of an instruction of starting the preview scan input from the operator through the operating console unit 32, transmits control signals to each of the RF driver unit 22, the gradient coil driver unit 23, and the data acquisition unit 24 to initiate the execution of preview scan. The preview scan initiator unit 252 in this embodiment, initiates a preview scan that has a scanning condition of a shorter scanning time than the actual imaging scan. For example, the unit initiates a preview scan under a scanning condition corresponding to a high speed pulse sequence, such as fast GRE (fast gradient echo) method, single shot fast SE (shingle shot fast spin echo) method.

The cradle 26 has a table for carrying the subject SU thereon, as shown in FIG. 1. The cradle 26, upon reception of the control signals from the controller unit 25, moves the subject SU carried on the table between the inside and outside of the imaging space B. In this embodiment the cradle 26 moves the subject SU along with the circle center axis direction C of the imaging space B in a form of cylinder.

The data processing unit 31 includes a computer, and a program for executing a predetermined data processing using the computer. The data processing unit 31 is connected to the operating console unit 32 and the operating signals are input from the operating console unit 32. The data processing unit 31 is connected to the controller unit 25 and the control signals input to the operating console unit 32 by the operator is received to output to the controller unit 25 to cause the controller unit 25 to control other components. The data processing unit 31 is also connected to the data acquisition unit 24 to obtain the magnetic resonance signals acquired by the data acquisition unit 24 and performs image processing on thus obtained magnetic resonance signals to reconstruct an image of the slice of the subject SU. The data processing unit 31 then outputs thus generated image to the display unit 33.

Figure 3:
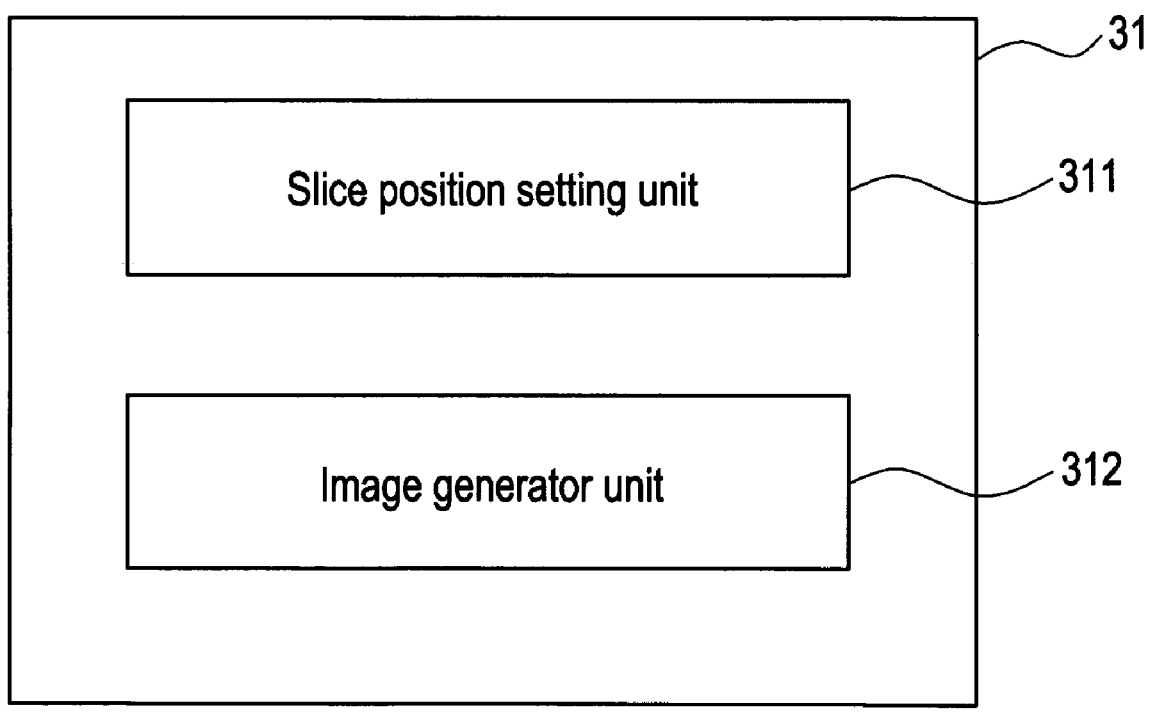
FIG. 3 is a schematic functional block diagram of the data processing unit 31 in a magnetic resonance imaging apparatus 1 of the first preferred embodiment of the present invention.

Now referring to FIG. 3, there is shown a schematic functional block diagram of the data processing unit 31 in a magnetic resonance imaging apparatus 1 of the first preferred embodiment of the present invention.

As shown in FIG. 3, the data processing unit 31 includes a slice position setting unit 311 and an image generator unit 312.

The slice position setting unit 311 of the data processing unit 31 sets a slice position at which the actual imaging scan is performed on the subject SU. In the present embodiment, in order to determine the slice position to be scanned in the actual imaging scan of the subject SU, the operator observes the position registration images of the slice in the axial plane, sagittal plane, and coronal plane of the subject SU, generated by the registration scan performed prior to the actual imaging scan and displayed on the display unit 33, uses a pointing device of the operating console unit 32 to input the slice position to be scanned in the actual imaging scan of the subject SU on the position registration image displayed on the display unit 33. The actual imaging scan initiator unit 251, upon reception of the instruction input from the operator through the operating console unit 32, sets the slice position to be scanned in the actual imaging scan of the subject SU. Then, the operation signals in this configuration are output to the controller unit 25 to perform the scanning at the slice position set in this configuration.

The image generator unit 312 of the data processing unit 31 generates an actual scanning image at the slice position of the subject SU determined by the slice position setting unit 311, based on the magnetic resonance signals obtained from the subject SU in the actual imaging scan initiated by the actual imaging scan initiator unit 251. The image generator unit 312 obtains as digital signals the magnetic resonance signals acquired by the data acquisition unit 24 in the course of the actual imaging scan, performs a Fourier transform on the magnetic resonance signals having converted to digital signals, to reconstruct an actual scanning image of the slice determined on the subject SU. The image generator unit 312 then outputs the image data of the actual imaging scan thus reconstructed to the display unit 33.

Furthermore, the image generator unit 312, upon reception of the magnetic resonance signals from the subject SU obtained during the preview scan initiated by the preview scan initiator unit 252, generates a preview image at the slice position set by the slice position setting unit 311. The image generator unit 312 obtains as digital signals the magnetic resonance signals acquired by the data acquisition unit 24 during the preview scan, and performs a Fourier transform on the magnetic resonance signals having converted to the digital signals, as have been done on the signals of the actual scanning image, to generate a preview image of the slice of the subject SU. The image generator unit 312 then outputs the image data of thus generated preview image to the display unit 33.

The operating console unit 32 includes a keyboard and a pointing device. The operating console unit 32 is operated by the operator and outputs the operation signals to the data processing unit 31 in correspondence with the operation.

In the present embodiment, the actual imaging scan start button for initiating the actual imaging scan is displayed as an image on the display screen of the display unit 33, and the instruction to initiate the actual imaging scan is input by the operator pressing the actual imaging scan start button by using the pointing device of the operating console unit 32. The operating console unit 32 in turn outputs the operation signals for initiating the actual imaging scan to the actual imaging scan initiator unit 251 of the controller unit 25 through the data processing unit 31 to execute the actual imaging scan.

In addition, the preview scan start button for initiating the preview scan is displayed as an image on the display screen of the display unit 33, and the instruction to initiate the preview scan is input by the operator pressing the preview scan start button by using the pointing device of the operating console unit 32. The operating console unit 32 in turn outputs the operation signals for initiating the preview scan to the preview scan initiator unit 252 of the controller unit 25 through the data processing unit 31 to execute the preview scan.

The display unit 33 may be a display device such as a CRT. The display unit 33 displays, in addition to images of the shot of the slice of the subject SU, the images indicating buttons and scanning condition.

In the present embodiment the display unit 33 displays the position registration image of the slice of the subject SU generated by the data processing unit 31 based on the magnetic resonance signals obtained from the subject SU in the course of the positioning registration scan performed in advance, in order to determine the slice position to be scanned in the actual imaging scan of the subject SU. For example, the display unit 33 displays the position registration images of the slice in the axial plane, sagittal plane, and coronal plane of the subject SU. Then the operator observes the position registration image of the slice in the axial plane, sagittal plane, and coronal plane of the subject SU, and the slice position image of the slice position input by the operator using the pointing device of the operating console unit 32 is displayed over the registration image.

The display unit 33 after having performed the actual imaging scan displays on the display screen the actual scanning image reconstructed by the image generator unit 312. The display unit 33 also displays on the display screen a preview image generated by the image generator unit 312 after having performed the preview scan.

Now the operation when performing the actual imaging scan of a slice of the subject SU by using the magnetic resonance imaging apparatus 1 of the present embodiment of the present invention as have been described above will be described in greater details herein below.

Figure 4:
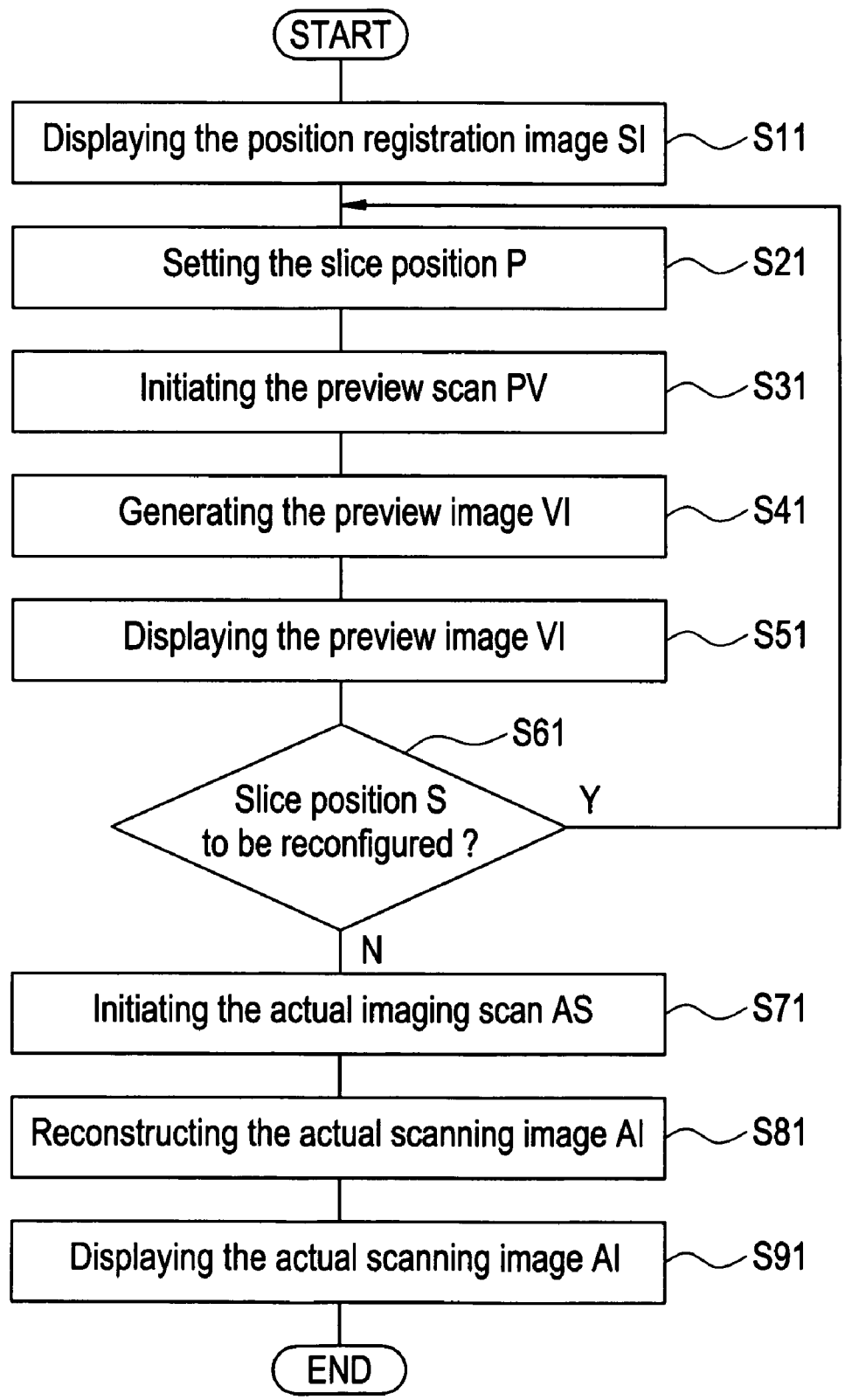
FIG. 4 is a flow diagram indicating the operation when imaging a slice of the subject SU in accordance with the preferred embodiment of the present invention.
Figure 5A:
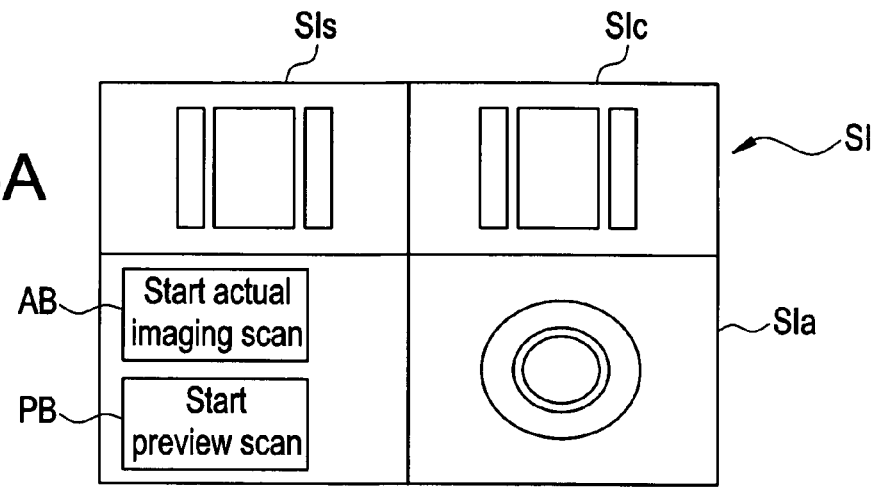
FIGS. 5a, 5b, and 5c are schematic diagrams indicating the display screen of the display unit 33 of the preferred embodiment in accordance with the present invention.
Figure 5B:
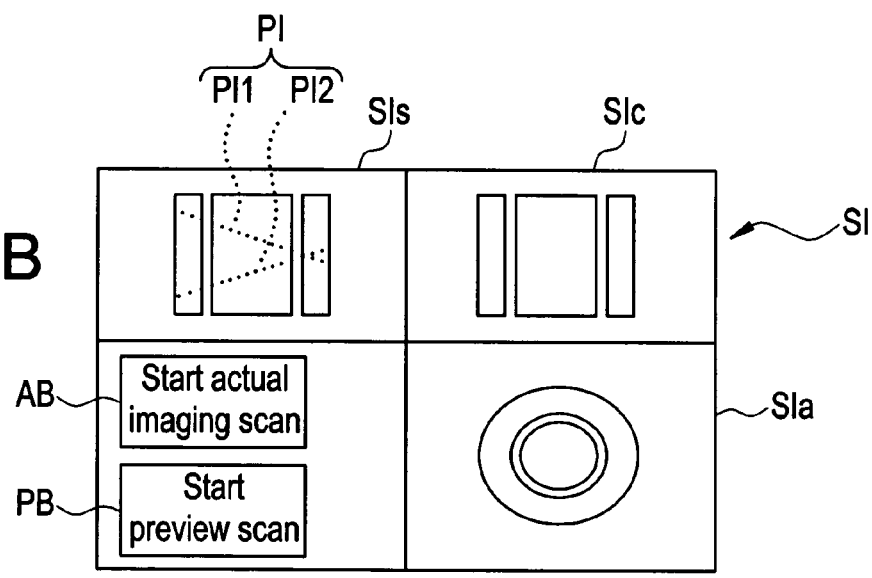
Figure 5C:
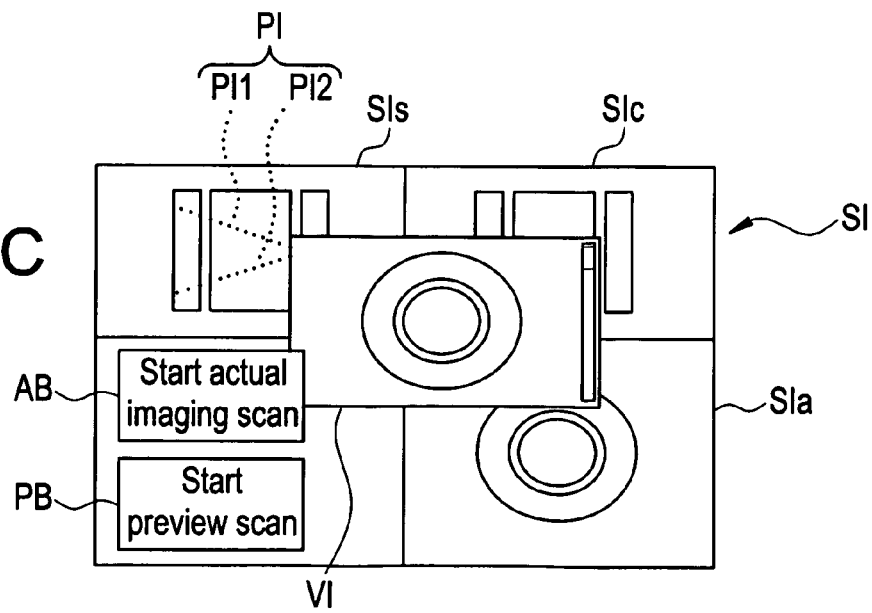

Now referring to FIG. 4 and FIG. 5, there are shown schematic diagrams illustrating the operation when imaging a slice of the subject SU in accordance with the preferred embodiment of the present invention.

Now FIG. 4 shows a flow diagram indicating the operation when imaging the slice of the subject SU in accordance with the preferred embodiment of the present invention.

FIG. 5, on the other hand, indicates the display screen of the display unit 33. FIG. 5 (*a*) indicates the display screen that displays the position registration image SI. FIG. 5 (*b*) indicates the display screen that displays the slice position image PI. FIG. 5 (*c*) indicates the display screen that displays the preview image VI.

When scanning AS a slice of the subject SU to perform imaging, the subject SU is placed on the cradle 26, then the RF coil unit 14 is placed to a position corresponding to the imaging area of the subject SU. The cradle 26 on which the subject SU is carried is controlled by the controller unit 25 to move into the imaging space B with the magnetostatic field formed.

Prior to actual imaging scan, a registration scan is performed in order to determine the slice position at which the subject SU is to be scanned in the actual imaging scan. Based on the magnetic resonance signals obtained from the subject SU during the registration scan, the data processing unit 31 generates a position registration image SI of the slice of the subject SU. In this embodiment, the position registration image SI is generated for each of the axial plane, sagittal plane, and the coronal plane of the subject SU.

Next, as shown in FIG. 4, the position registration image SI is displayed (S11).

As shown in FIG. 5 (*a*), three position registration images SI, namely the position registration image SIa for the axial plane of the subject SU, the position registration image SIs for the sagittal plane, and the position registration image SIc for the coronal plane are displayed in tiled fashion corresponding to the vertically and horizontally split four areas of the screen of the display unit 33. The images of the actual imaging scan start button AB for initiating the actual imaging scan AS and of the preview scan start button PB for initiating the preview scan PV are displayed on the display unit 33 in the area where position registration image SI is not displayed.

Then, as shown in FIG. 4, the slice position P is set (S21).

In this context, the operator observes three position registration images SI, namely the position registration image SIa for the axial plane of the subject SU, the position registration image SIs for the sagittal plane, and the position registration image SIc for the coronal plane. As shown in FIG. 5 (*b*), a slice position P is input for example on the position registration image SIs for the sagittal plane by using the pointing device of the operating console unit 32 and the display unit 33 displays the slice position image PI for the slice position P on the position registration image SIs. In this preferred embodiment, first slice position P1 and second slice position P2, which are mutually crossing lines, are input by the operator as the slice position P, and two slice position images PI, constituted of a linear first slice position image PI1 corresponding to the first slice position P1 and a linear second slice position image PI2 corresponding to the second slice position P2 are displayed on the display unit 33 so as to overlay on the position registration image SIs for the sagittal plane.

Then, as shown in FIG. 4, a preview scan PV is initiated (S31).

In this embodiment the operator presses the preview scan start button PB displayed as an image on the display screen of the display unit 33 by using the pointing device of the operating console unit 32. This inputs an instruction to initiate the preview scan PV into the operating console unit 32. Then the operation signals for starting the preview scan PV is output by the operating console unit 32 through the data processing unit 31 to the preview scan initiator unit 252 of the controller unit 25 to perform the preview scan PV to scan at the slice position P set by the slice position setting unit 311. More specifically, the preview scan initiator unit 252, upon reception of an instruction of starting the preview scan PV input by the operator to the operating console unit 32, transmits the control signals to each of the RF driver unit 22, the gradient coil driver unit 23, and the data acquisition unit 24 to execute the scanning at the first slice position P1 and the second slice position P2 as the preview scan PV. In this embodiment the preview scan initiator unit 252 initiates a preview scan PV of the scanning condition that has a shorter scanning time than the actual imaging scan AS. For example, the preview scan PV may be executed under the scanning condition accommodating to the pulse sequence such as Fast GRE method or single shot fast SE method.

Thereafter, as shown in FIG. 4, a preview image VI is generated (S41).

The image generator unit 312, based on the magnetic resonance signals from the subject SU obtained by the preview scan PV, generates the preview image VI at the slice position P set by the slice position setting unit 311. In this embodiment, the image generator unit 312 sequentially generates as preview image VI first preview image VI1 for the axial plane of the subject SU corresponding to the first slice position P1 and second preview image VI2 for the axial plane of the subject SU corresponding to the second slice position P2. The image generator unit 312 then outputs the image data of thus generated preview image VI to the display unit 33.

Then, as shown in FIG. 4, the preview image VI is displayed (S51).

In this context the preview image VI generated by the image generator unit 312 is displayed on the display screen by the display unit 33. In this embodiment, as shown in FIG. 5 (*c*), a window is provided on the position registration image SI to display the preview image VI therein by the display unit 33. More specifically, two preview images VI namely the first preview image VI1 for the axial plane of the subject SU corresponding to the first slice position P1 and the second preview image VI2 for the axial plane of the subject SU corresponding to the second slice position P2 are displayed by the display unit 33. For example, in accordance with the instruction input by the operator to the operating console unit 32, any one of two preview images VI of first preview image VI1 and second preview image VI2 is selectively displayed by the display unit 33.

Then, as shown in FIG. 4, it is determined whether the slice position S is to be reconfigured or not (S61).

In this context the operator observes the preview images VI displayed on the display screen of the display unit 33, to determine whether or not a desired image has been obtained. For instance, the operator checks to see whether some artifacts are present in the preview images VI, as well as whether or not imaging of any necessary area is performed.

If the preview image VI is not a desired one, as shown in FIG. 4, the setting of slice position S will be reconfigured to perform again a series of operations as in above-mentioned steps (S21, S31, S41, S51).

If otherwise the preview image VI is a desired one, as shown in FIG. 4, the actual imaging scan AS will be initiated (S71).

In this context, the operator presses the actual imaging scan start button AB displayed as an image on the display screen of the display unit 33 by using the pointing device of the operating console unit 32. The instruction to initiate the actual imaging scan HS is thereby input into the operating console unit 32. The operation signals for starting the actual imaging scan AS is then output by the operating console unit 32 through the data processing unit 31 to the actual imaging scan initiator unit 251 of the controller unit 25 to perform the actual imaging scan AS to scan at the slice position P set by the slice position setting unit 311. More specifically, based on the instruction to start the actual imaging scan AS input into the operating console unit 32 by the operator, the actual imaging scan initiator unit 251 transmits the control signals to the RF driver unit 22, the gradient coil driver unit 23, and the data acquisition unit 24 to scan the first slice position P1 and the second slice position P2 as the actual imaging scan AS.

Next, as shown in FIG. 4, the actual scanning image AI is generated (S81).

In this context the image generator unit 312 reconstructs the actual scanning image AI at the slice position P set by the slice position setting unit 311, based on the magnetic resonance signals from the subject SU obtained by the actual imaging scan AS. In this preferred embodiment, two actual scanning images, namely first actual scanning image AI1 for the axial plane of the subject SU corresponding to the first slice position P1 and the second actual scanning image AI2 for the axial plane of the subject SU corresponding to the second slice position P2 are sequentially reconstructed by the image generator unit 312 as the actual scanning image AI. The image generator unit 312 then outputs the image data for thus generated actual scanning image AI to the display unit 33.

Next, as shown in FIG. 4, the actual scanning image AI is displayed (S91).

In this context the actual scanning image AI generated by the image generator unit 312 is displayed on the display screen by the display unit 33.

As have been described above, in the preferred embodiment presented as above, a preview scan PV for scanning at the slice position P set by the slice position setting unit 311 is initiated by the preview scan initiator unit 252 prior to performing the actual imaging scan AS. Here the preview scan initiator unit 252 upon reception of the instruction from the operator starts a preview scan PV that has a scan condition of shorter scanning time than the actual imaging scan AS. The image generator unit 312 generates the preview image VI for the slice position set by the slice position setting unit 311 based on the magnetic resonance signals from the subject SU obtained by the preview scan PV initiated by the preview scan initiator unit 252. The preview image VI generated by the image generator unit 312 is then displayed on the display screen by the display unit 33. In the preferred embodiment, observation of the preview image VI allows the operator to confirm whether a desirable image can be obtained in the actual imaging scan prior to performing the actual imaging scan.

In particular, when a plurality of slice positions P to be performed each an actual imaging scan AS is mutually intersecting, or when the distance between slices in a plurality of slice positions P is narrower, the signals at the slice position P may mutually generate a crosstalk due to the RF pulses which are not in the correct shape of square waves, to produce some artifacts on the images. By observing the preview image VI, the presence or absence of such artifacts on the image can be confirmed. In addition, by observing the preview image VI, the presence or absence of such artifacts caused by phase folding can also be verified, as well as it can be determined whether or not imaging of necessary area is performed.

In the preferred embodiment, the repetitive execution of the actual imaging scan AS is no longer needed, allowing the imaging of a subject to be much efficiently.

The magnetic resonance imaging apparatus 1 in the above mentioned preferred embodiment corresponds to the magnetic resonance imaging apparatus in accordance with the present invention. The display unit 33 of the above preferred embodiment corresponds to the preview image display unit. The preview scan initiator unit 252 of the above preferred embodiment corresponds to the preview scan initiator unit in accordance with the present invention. The slice position setting unit 311 of the above preferred embodiment corresponds to the slice position setting unit in accordance with the present invention. And the image generator unit 312 of the above preferred embodiment corresponds to the preview image generator unit.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus which includes a slice position setting unit for setting a slice position to perform an actual imaging scan on a subject, and which generates the actual scanning image at the slice position of said subject set by said slice position setting unit based on magnetic resonance signals obtained from said subject by means of said actual imaging scan, comprising:
 a preview scan initiator unit, for initiating a preview scan to scan the slice position set by said slice position setting unit prior to performing said actual imaging scan; and
 a preview image generator unit for generating a preview image at the slice position set by said slice position setting unit based on the magnetic resonance signals from said subject obtained by said preview scan initiated by said preview scan initiator unit.

2. A magnetic resonance imaging apparatus according to claim 1, further comprising:
 a preview image display unit for displaying the preview image generated by said preview image generator unit.

3. A magnetic resonance imaging apparatus according to claim 1, wherein
 said preview scan initiator unit initiates said preview scan in a scan condition that has a shorter scanning time than said actual imaging scan.

4. A magnetic resonance imaging apparatus according to claim 3, wherein
 said preview scan initiator unit performs said preview scan in either Fast GRE method or single shot Fast SE method.

5. A magnetic resonance imaging apparatus according to claim 1, wherein
 said preview scan initiator unit initiates said preview scan in response to an instruction given by the operator.

6. A magnetic resonance imaging method, which sets a slice position to perform an actual imaging scan on a subject, and generates an actual scanning image at the slice position set on said subject based on the magnetic resonance signals obtained from said subject by said actual imaging scan, said method comprising:

a first step of initiating a preview scan to scan at the slice position having been set, prior to performing said actual imaging scan; and a second step of generating a preview image at said slice position having been set based on the magnetic resonance signals from said subject obtained by said preview scan initiated in said first step.

7. A magnetic resonance imaging method according to claim 6, further comprising:

a third step of displaying the preview image generated in said second step.

8. A magnetic resonance imaging method according to claim 6, wherein said preview scan is performed in said first step in a scan condition that has a shorter scanning time than said actual imaging scan.

9. A magnetic resonance imaging method according to claim 8, wherein said preview scan is conducted in said first step according to either fast GRE method or single shot fast SE method.

10. A magnetic resonance imaging method according to claim 6, wherein said preview scan is initiated in said first step in response to the instruction given by the operator.

* * * * *